United States Patent [19]
Adresen et al.

[11] Patent Number: 5,487,093
[45] Date of Patent: Jan. 23, 1996

[54] AUTORANGING DIGITAL ANALOG PHASE LOCKED LOOP

[75] Inventors: Bernhard H. Adresen, Dallas; Roger A. Cline, Plano, both of Tex.

[73] Assignee: Texas Instruments Incorporated, Dallas, Tex.

[21] Appl. No.: 249,564

[22] Filed: May 26, 1994

[51] Int. Cl.$^6$ ..................................................... H03D 3/24
[52] U.S. Cl. .............................. 375/376; 331/11; 331/34; 331/1 A
[58] Field of Search ............................ 375/120; 331/1 R, 331/2, 10, 11, 34, 1 A, 58, DIG. 3, 25

[56] References Cited

U.S. PATENT DOCUMENTS

| | | | |
|---|---|---|---|
| 4,272,729 | 6/1981 | Riley, Jr. | 331/1 A |
| 5,015,970 | 5/1991 | Williams et al. | 331/11 |
| 5,160,900 | 11/1992 | Visuri | 375/376 |
| 5,208,839 | 5/1993 | Hladik et al. | 375/376 |
| 5,285,483 | 2/1994 | Ogawa et al. | 375/376 |
| 5,363,419 | 11/1994 | Ho | 375/120 |

*Primary Examiner*—Stephen Chin
*Assistant Examiner*—Don N. Vo
*Attorney, Agent, or Firm*—Thomas G. Eschweiler; James C. Kesterson; Richard L. Donaldson

[57] ABSTRACT

An autoranging digital/analog (D/A) phase locked loop (PLL) 10 includes a frequency discriminator circuit 12 connected to a shift register 14. Shift register 14 is connected to a voltage controlled oscillator circuit (VCO) 16. VCO 16 is connected to generic counter 17. Counter 17 is optional in this preferred embodiment. Counter 17 is connected to a phase detector 13 and frequency discriminator 12. Phase detector 13 is connected to a charge pump control circuit 15. Charge pump control circuit 15 is also connected to VCO 16. A second generic counter 11 is connected to frequency discriminator 12. Second counter 11 is also optional in this preferred embodiment. First generic counter 17 and second generic counter 11 can be implemented to reduce the phase detector frequency relative to VCO 16 or a reference clock signal frequency. Ratios of M to N allow frequency multiplication or division of VCO 16 relative to the reference clock signal frequency. A method for achieving phase lock between a first signal and a second signal, in accordance with the present invention, comprises the steps of comparing the phases of the first signal and the second signal, adjusting the frequency of the second signal in a digital fashion until the phases of the first signal and second signal are within a predetermined phase relationship; and adjusting the frequency of the second signal in an analog fashion until a phase lock is obtained between the first signal and the second signal.

8 Claims, 4 Drawing Sheets

| STATE | COUNTER 1 | |
|---|---|---|
| 1 | 0 | 0 |
| 2 | 1 | 0 |
| 3 | 1 | 1 |
| 4 | 0 | 1 |
COMPARE NOW → 3
| STATE | COUNTER 2 | | | | |
|---|---|---|---|---|---|
| 1 | 0 | 0 | 0 | 0 | TOO SLOW, SPEED UP ↑ |
| 2 | 1 | 0 | 0 | 0 | |
| 3 | 1 | 1 | 0 | 0 | |
| 4 | 1 | 1 | 1 | 0 | |
| 5 | 1 | 1 | 1 | 1 | |
| 6 | 0 | 1 | 1 | 1 | |
| 7 | 0 | 0 | 1 | 1 | |
| 8 | 0 | 0 | 0 | 1 | ↓ TOO FAST, SLOW DOWN |
*FIG. 8*
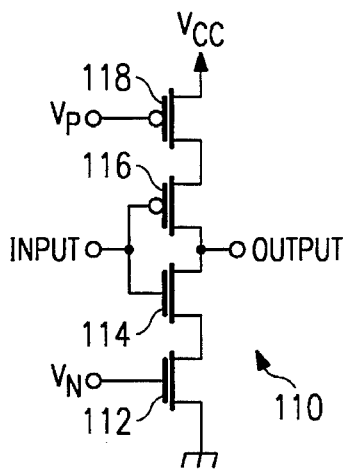
*FIG. 9*
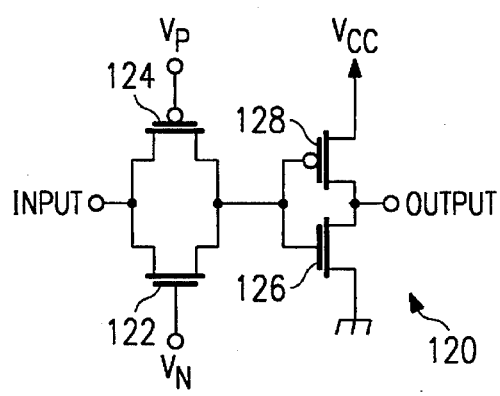
*FIG. 9a*

AUTORANGING DIGITAL ANALOG PHASE LOCKED LOOP

FIELD OF THE INVENTION

This invention relates generally to electronic circuits and more particularly relates to phase locked loop circuits.

BACKGROUND OF THE INVENTION

Electrical systems often incorporate phase locking mechanisms to obtain phase continuity with the system. Prior art phase locked loops have often provided this function. Prior art phase locked loops fall into two categories: digital phase locked loops and analog phase locked loops.

Digital phase locked loops are advantageous in that they quickly achieve the desired phase lock. However, they suffer from poor phase lock resolution. This shortcoming becomes highly significant in high frequency systems that require high phase lock resolution.

Analog phase locked loops are advantageous because they provide fine phase lock resolution that is necessary in high performance system. However, they suffer from speed limitations because each adjustment is incrementally small and a larger number of adjustments are necessary. Therefore, with analog phase locked loops one achieves greater phase lock resolution at the expense of slow phase lock timing.

It is an object of this invention to provide an autoranging analog phase locked loop that incorporates the advantages of both digital and analog phase locked loops by quickly achieving a phase lock having a small phase resolution. The autoranging feature additionally allows a simple current starved inverter chain to be used as a wide frequency range voltage controlled oscillator with constant gain, a desirable trait for analog phase locked loop design. Other objects and advantages of the invention will be apparent to those of ordinary skill in the art having reference to the following specification and drawings.

SUMMARY OF THE INVENTION

This invention includes a method of achieving phase lock between a first signal and a second signal. This novel method comprises the steps of comparing the phases of the first signal and the second signal, adjusting the frequency of the second signal in a digital fashion until the phases of the first signal and second signal are within a predetermined phase relationship and adjusting the frequency of the second signal in an analog fashion until a phase lock is obtained between the first signal and the second signal.

BRIEF DESCRIPTION OF THE DRAWINGS

FIG. 8 is a chart illustrating how first counter 36 and second counter 38 are compared in compare circuit 40.

FIG. 9 is a schematic diagram illustrating an inverter 110 that behaves as an analog delay element.

FIG. 9a is another schematic diagram illustrating a second inverter 120 that behaves as an analog delay element.

DETAILED DESCRIPTION OF THE PREFERRED EMBODIMENT

Figure 1:
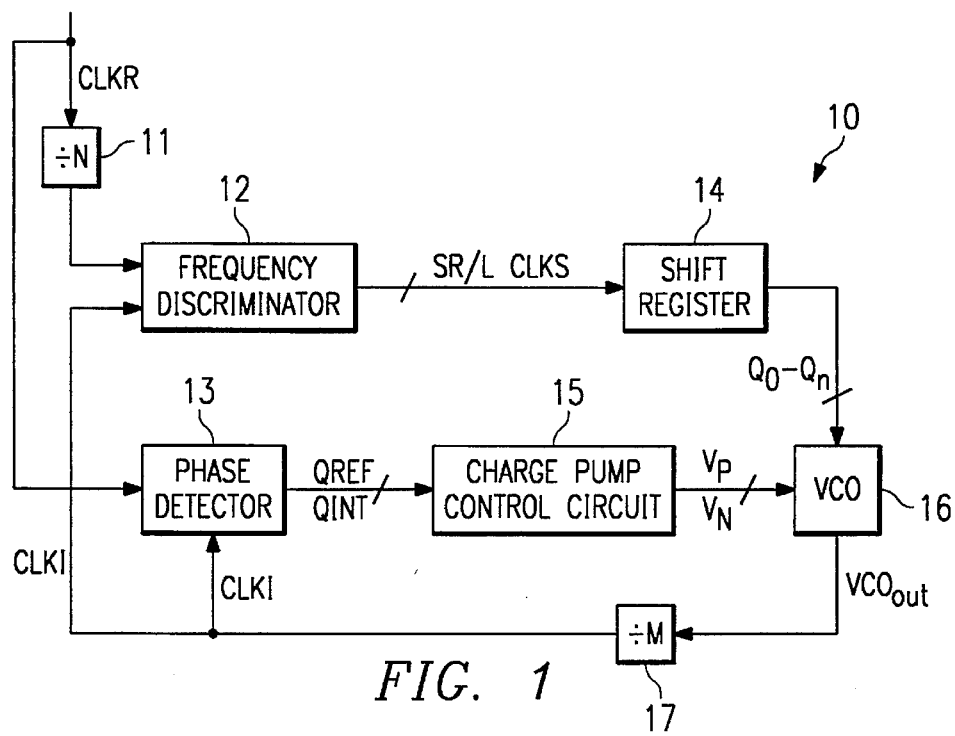
FIG. 1 is a block diagram illustrating the preferred embodiment of the invention, an autoranging D/A phase locked loop 10.

FIG. 1 is a block diagram illustrating the preferred embodiment of the invention, an autoranging digital/analog (D/A) phase locked loop (PLL) 10. PLL 10 includes a frequency discriminator circuit 12 connected to a shift register 14. Shift register 14 is connected to a voltage controlled oscillator circuit (VCO) 16. VCO 16 is connected to generic counter 17. Counter 17 is optional in this preferred embodiment. Counter 17 is connected to a phase detector 13 and frequency discriminator 12. Phase detector 13 is connected to a charge pump control circuit 15. Charge pump control circuit 15 is also connected to VCO 16. A second generic counter 11 is connected to frequency discriminator 12. Second counter 11 is also optional in this preferred embodiment. First generic counter 17 and second generic counter 11 can be implemented to reduce the phase detector frequency relative to VCO 16 or a reference clock signal frequency. Ratios of M to N allow frequency multiplication or division of VCO 16 relative to the reference clock signal frequency.

Frequency discriminator 12, shift register 14, and VCO 16 work together in a digital mode. Frequency discriminator 12 converts a comparison of an internal clock signal CLKI and a reference clock signal CLKR into digital control signals. Shift register 14 takes these digital control signals and creates a binary "word" which causes digital adjustments of frequency in CLKI through VCO 16. After CLKR and CLKI get close enough in frequency, digital adjustment discontinues. Phase detector 13, charge pump control circuit 15 and VCO 16 continue to make analog adjustments. Phase detector 13 converts a comparison of CLKR and CLKI into digital signals. Charge pump control circuit 15 converts the digitals signals into analog control signals that dictate analog adjustments in frequency of CLKI through VCO 16.

Figure 2:
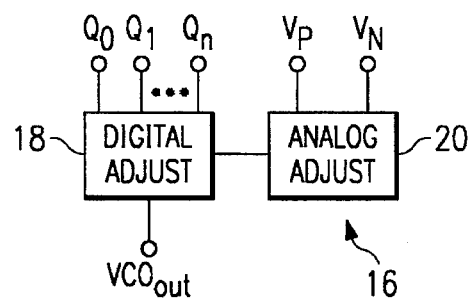
FIG. 2 is a block diagram illustrating the two components of voltage controlled oscillator 16.

FIG. 2 is a block diagram illustrating the two components of VCO 16. VCO 16 has a digital adjust circuit 18 that receives a plurality of digital inputs from shift register 14 ($Q_0$–$Q_n$) that form a digital word and dictate the number of delay stages in VCO 16. VCO 16 may, for example, be an inverter chain coupled together serially in a loop. Further, VCO 16 has an analog adjust circuit 20 coupled to digital adjust circuit 18. Analog adjust circuit 20 accepts analog control signals $V_P$ and $V_N$ and adjusts the frequency in VCO 16 in an analog fashion.

Figure 3:
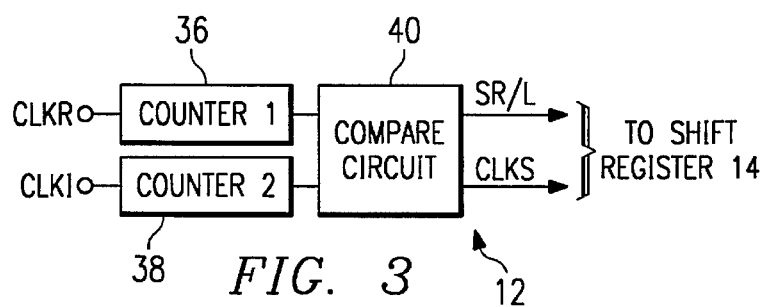
FIG. 3 is a block diagram illustrating frequency discriminator circuit 12.

FIG. 3 is a block diagram illustrating in greater detail frequency discriminator circuit 12. Frequency discriminator circuit 12 includes a first counter 36 and a second counter 38. First counter 36 is a two-bit Johnson-type counter which is well known by those skilled in the art and incrementally counts through four distinct values before repeating the digital sequence. First counter 36 is clocked by reference clock signal CLKR. Second counter 38 is a four-bit Johnson-type counter and is well known by those skilled in the art and incrementally counts through eight distinct values before repeating its digital sequence. Second counter 38 is clocked by internal clock signal CLKI. First counter 36 and second counter 38 each provide an output to compare circuit 40. Compare circuit 40 is triggered by a specific count from first counter 36 and looks to see the binary value of second counter 38 at that instant in time. Compare circuit 40 then makes a determination from the binary value of second counter 38 at that instant whether internal clock signal CLKI is running too slow or too fast. Compare circuit 40 outputs two digital signals, SR/L (shift right or left) and CLKS, to shift register 14 in order to appropriately increase or decrease the speed of internal clock signal CLKI.

Figure 4:
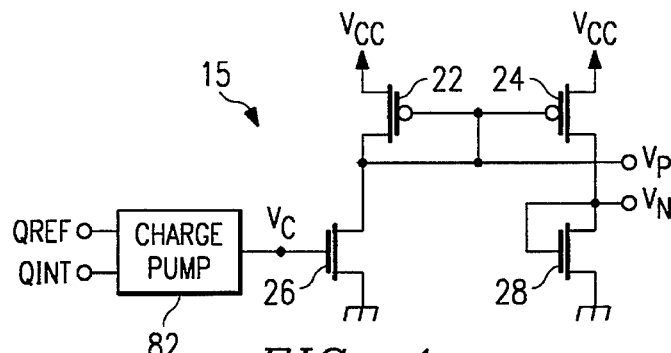
FIG. 4 is a combined block diagram and schematic diagram of charge pump control circuit 15.

FIG. 4 is a combined block diagram and schematic diagram of charge pump control circuit 15 which receives digital signals QREF and QINT from phase detector 13 and converts them into analog control signals $V_P$ and $V_N$. Charge pump control circuit 15 includes a charge pump 82 which receives digital signals QREF and QINT and outputs a control voltage, $V_c$. Control voltage, $V_c$, drives the gate of an NMOS transistor 26. Transistor 26 has a source terminal connected to circuit ground and a drain terminal connected to a drain terminal of a PMOS transistor 22. Transistor 22 has a source terminal connected to a power supply Vcc and a gate terminal connected to both its drain terminal and to a gate terminal of a second PMOS transistor 24. Transistor 24 has a source terminal connected to the power supply Vcc and a drain terminal connected to a drain terminal of a second NMOS transistor 28. NMOS transistor 28 has a source terminal connected to circuit ground and a gate terminal which is connected to its drain terminal and forms analog control output $V_N$. The drain terminal of transistor 22 forms a second analog control terminal $V_P$.

Figure 4A:
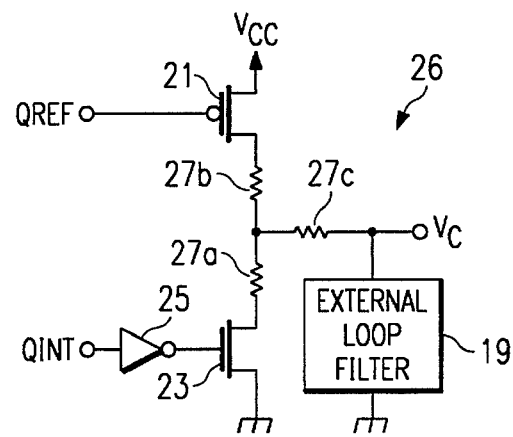
FIG. 4a is a combined block diagram and schematic diagram illustrating in greater detail charge pump 26 in charge pump control circuit 15.

FIG. 4a is a combined block diagram and schematic diagram of charge pump 82. Charge pump 82 includes a PMOS transistor 21 coupled to NMOS transistor 23 through two serially coupled resistors 27a and 27b. A third resistor 27c has one terminal connected to the junction of the two serially coupled resistors 27a and 27b and a second terminal forming the charge pump output $V_c$. An external loop filter 19 is coupled between the charge pump output and ground. Digital signal QREF is coupled to the gate of PMOS transistor 21, and digital signal QINT is coupled to the gate of NMOS transistor 23 through an inverter 25. The output of charge pump $V_c$ increases or decreases in an analog manner as the capacitance in external loop filter is either charged via PMOS transistor 21 or discharged through NMOS transistor 23.

Figure 5:
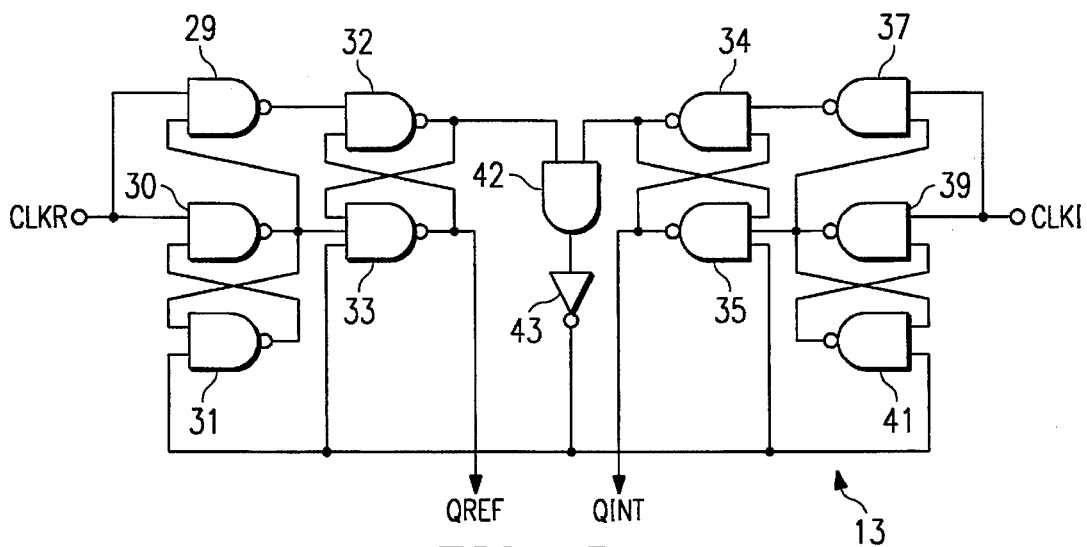
FIG. 5 is a logic diagram illustrating phase detector 13.

FIG. 5 is a logic diagram illustrating phase detector 13 of FIG. 1. Phase detector 13 includes four latches comprising pairs of cross-coupled NAND gates: 30 and 31, 32 and 33, 34 and 35, and 39 and 41. The output of NAND gate 30 is also coupled to NAND gate 29 as an input. Similarly, the output of NAND gate 39 is also connected to NAND gate 37 as an input. CLKR forms inputs to NAND gates 29 and 30 and CLKI forms inputs to NAND gates 37 and 39. The outputs of NAND gates 32 and 34 form inputs to AND gate 42. The output of AND gate 42 feeds an inverter 43. The output of inverter 43 forms the second input to NAND gates 31, 33, 35, and 41. The output of NAND gate 33 forms the QREF output which feeds charge pump 82, and the output of NAND gate 35 forms the QINT output which also feeds charge pump 82 within charge pump control circuit 15.

Figure 6:
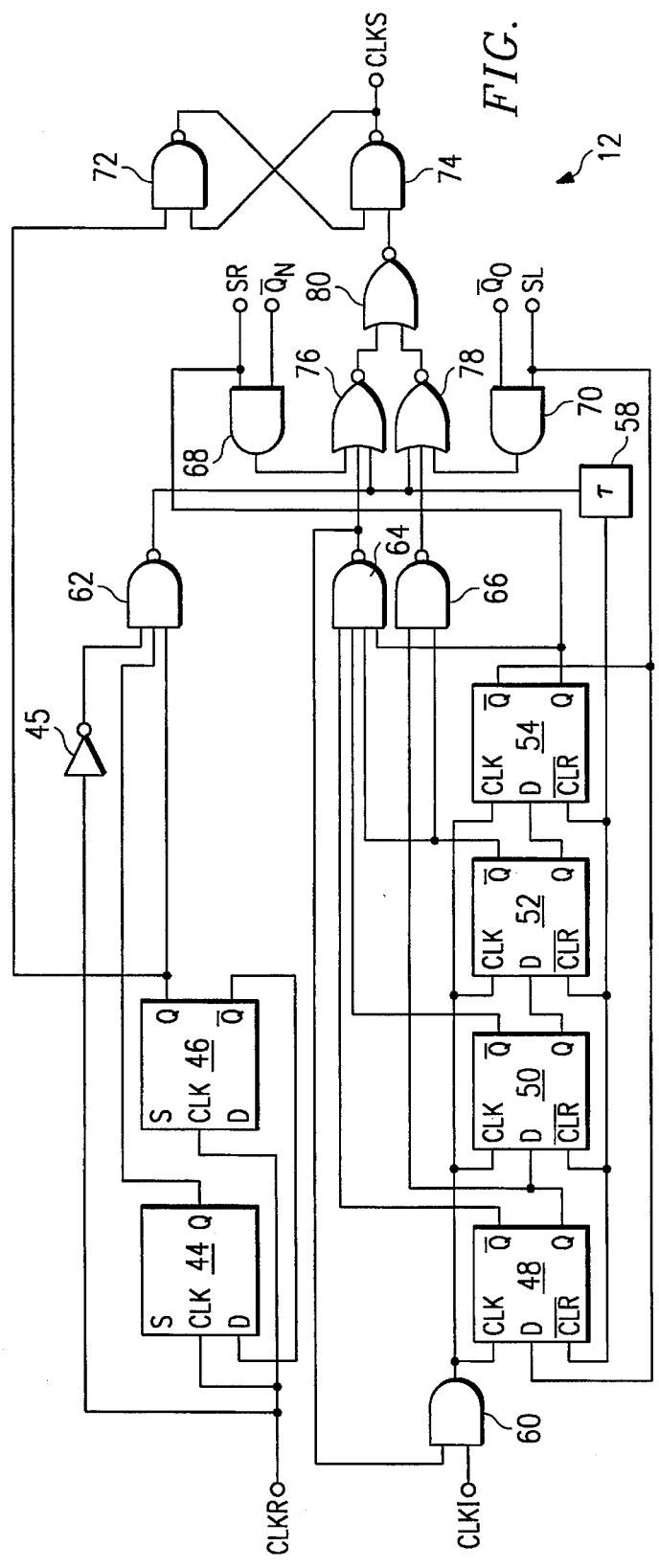
FIG. 6 is a logic diagram illustrating frequency discriminator circuit 12 of FIG. 5.

FIG. 6 is a schematic diagram illustrating in greater detail frequency discriminator circuit 12 of FIG. 3. First counter 36 of FIG. 3 includes flip-flops 44 and 46, while second counter 38 of FIG. 3 includes flip-flops 48, 50, 52 and 54. Compare circuit 40 of FIG. 3 includes AND gates 60, 68 and 70, NAND gates 62, 64, 66, 72, and 74, NOR gates 76, 78 and 80, and delay circuit 58. Compare circuit 40 of FIG. 3 compares the outputs of first counter 36 and second counter 38 and provides appropriate control signals CLKS and SR/L to increase or decrease the frequency of VCO 16 as needed.

Figure 7:
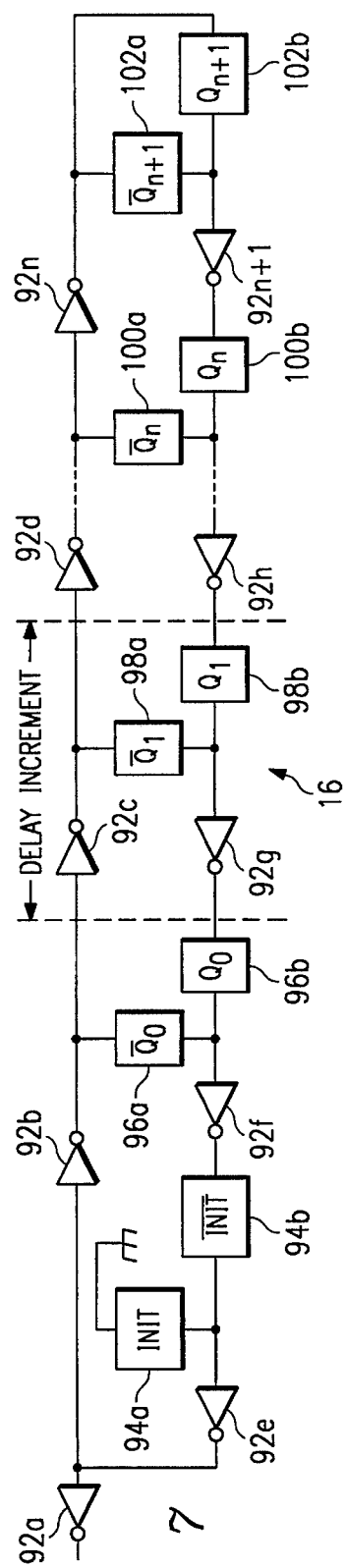
FIG. 7 is a block diagram illustrating voltage controlled oscillator 16.

FIG. 7 is a block diagram illustrating voltage controlled oscillator circuit (VCO) 16. VCO 16 includes a plurality of delay cells coupled together serially. Each cell consists of two inverters (for example 92c and 92g) and two pass gates (for example $Q_1$, 98b and $Q_1$(bar), 98a). The number of delay cells coupled together in a serial fashion is dependent upon the frequency range needed in the system application and may vary from one system to another. VCO 16 varies the frequency of CLKI in both a digital and analog manner. VCO 16 varies the frequency of CLKI digitally by varying the number of delay increments via pass gates 96a–102a and 96b–102b. VCO 16 varies the frequency of CLKI in an analog manner through modification of the delay through each inverter stage 92b–92n+1. The analog modification is more completely described in discussions of FIGS. 9 and 9a.

FIG. 8 is a chart which illustrates how first counter 36 and second counter 38 are compared by compare circuit 40. Further, FIG. 8 illustrates what adjustments are taken in response to the comparison by compare circuit 40.

FIG. 9 is a schematic diagram illustrating an inverter 110 that behaves as an analog delay element. Inverter 110 has an NMOS transistor 112 having a source connected to ground potential, a gate terminal connected to analog control voltage $V_N$ and a drain terminal connected to a source terminal of NMOS transistor 114. NMOS transistor 114 has a drain terminal that forms the OUTPUT of inverter 110 and is coupled to a drain terminal of a PMOS transistor 116. NMOS transistor 114 has a gate terminal that is connected to a gate terminals of PMOS transistor 116 and also serves as the INPUT of inverter 110. PMOS transistor 116 has a source terminal connected to a drain terminal of a PMOS transistor 118, PMOS transistor 118 has a gate terminal connected to analog control voltage $V_P$ and a source terminal. connected to power supply Vcc.

FIG. 9a is a schematic diagram illustrating an inverter 120 that also behaves as an analog delay element. Inverter 120 has an NMOS transistor 126 having a source terminal connected to ground potential, a drain terminal that forms the OUTPUT of inverter 120 and is connected to a drain terminal of a PMOS transistor 128. NMOS transistor 126 has a gate terminal connected to a gate terminal of PMOS transistor 128. PMOS transistor 128 has a source terminal connected to power supply Vcc. The gate terminals of NMOS transistors 126 and 128 are connected to a pass gate which includes an NMOS transistor 122 and a PMOS transistor 124 coupled in parallel. NMOS transistor 122 and PMOS transistor 124 have their source terminals connected together and their drain terminals connected together. The drain terminals form the INPUT of inverter 120 while the source terminals are connected to the gate terminals of NMOS transistors 126 and 128. The gate terminal of NMOS transistor 122 is connected to analog control voltage $V_N$, and the gate terminal of PMOS transistor 124 is connected to analog control voltage $V_P$.

Autoranging D/A phase locked loop (PLL) 10 operates in the following manner. Frequency discriminator circuit 12 takes, as inputs, a reference clock signal CLKR (assuming counter 11 is a divide by "1" counter) and an internal clock signal CLKI, compares their relative frequencies, and responds to the comparison by sending output signals, control signal CLKS and shift right/left signal SR/L, to shift register 14. Shift register 14 takes signals CLKS (a clocking signal) and SR/L and appropriately shifts either a digital "1" to the right or a digital "0" to the left. The activation of shift register 14 provides incremental frequency changes to internal clock signal CLKI by shifting a "1" or a "0" and thereby forming a new digital "word" which is communicated to VCO 16. Shift register 14 therefore provides the digital control signals (the digital word) for VCO 16. The new digital word either adds or subtracts two discrete delay stages (or one delay increment as illustrated in FIG. 7) to internal clock signal CLKI. Each delay stage represents a delay through a single one of inverters 92b–92n+1. This is the digital adjust mode of PLL 10. In addition, VCO 16 advantageously has analog control capability. After CLKI has gotten close enough in frequency with CLKR to be within a specified window of time (which is determined by states 4–7 in FIG. 8), digital adjustments discontinue and PLL 10 switches to analog mode and achieves fine adjustment via an analog manipulation of VCO 16. It should be noted that PLL 10 does not technically "switch" to analog mode. Analog adjustment occurs continuously even during digital adjust mode. However, because the analog adjustments are so minute in comparison to the digital adjustments, no impact of the analog adjustments is discerned while in digital adjust mode. When digital adjust mode is complete the analog adjustments continue and the remaining phase locking occurs in analog mode alone.

With respect to FIG. 3 and FIG. 6, frequency discriminator circuit 12 accepts two digital signals, CLKR, which drives first counter 36, and CLKI, which drives second counter 38. The manner in which first counter 36 and second counter 38 are driven is shown in greater detail in FIG. 6, where CLKR acts as a clock input signal for flip-flops 44 and 46 while CLKI acts as a clock input signal for flip-flops 48, 50, 52 and 54 through AND gate 60. First counter 36 is a standard Johnson-type counter that increments in the pattern illustrated in FIG. 8. At PLL 10 initialization, first counter 36 starts at word value "00" wherein the first bit represents the "Q" output of flip-flop 44 and the second bit represents the "Q" output of flip-flop 46. First counter 36 proceeds to cycle through the binary values listed in FIG. 8 as is typical for Johnson-type counters. The "Q" outputs of flip-flops 44 and 46 and CLKR(bar) drive NAND gate 62. NAND gate 62 provides two functions: first, it provides enable inputs to NOR gates 76 and 78 and second, it drives the CLR(bar) input to flip-flops 48, 50, 52 and 54 of second counter 38 through delay circuit 58.

The outputs of first counter 36 and second counter 38 are compared in the following manner: first counter 36 increments in the sequence illustrated in FIG. 8, "00", "10", "11", "01", and increments at a rate determined by its clocking signal, reference clock signal CLKR. The "Q" outputs of flip-flops 44 and 46 drive NAND gate 62. Therefore the output of NAND gate 62 is binary value "1" at all times except when the binary sequence of flip-flops 44 and 46 is "11" and CLKR(bar) is high, when the output of NAND gate 62 becomes a binary value "0". NAND gate 62 drives NOR gates 76 and 78 and a clear input (CLR(bar)) of flip-flops 48, 50, 52 and 54 through delay circuit 58. Delay circuit 58 merely provides enough delay to ensure that the state of counter 38 is recognized before flip-flops 48, 50, 52 and 54 are cleared. The output of NAND gate 62 driving NOR gates 76 and 78 provides an enable function to NOR gates 76 and 78 by allowing the outputs of NOR gates 76 and 78 to follow the outputs of NAND gates 64 and 66, respectively, when the output of NAND gate 62 is low. NAND gate 62 and NOR gates 76 and 78 provide the function illustrated in FIG. 8 of effectively looking at the sequence of second counter 38 each time the sequence of first counter 36 reaches the value "11". If the value of second counter 38 at that moment is less than state four (state "1110"), then the output of NAND gate 66 is "0" thus making the output of NOR gate 78 a "1". This indicates that internal clock signal CLKI (which dictates the rate of second counter 38) is too slow and therefore needs to have stages in VCO 16 removed. If the value of second counter 38 at that moment is greater than state seven (state "0011"), then the output of NAND gate 64 is a "0" thus making the output of NOR gate 76 a "1". This indicates that internal clock signal CLKI is too fast and therefore needs to have stages in VCO 16 added. Therefore, the output of NOR gate 76, when a binary value "1", indicates that CLKI needs to be slowed down while the output of NOR gate 78, when a binary value of "1", indicates that CLKI needs to be sped up. Finally, when second counter 38 is at state four, five, six or seven (states "1110", "1111", "0111" or "0011"), when first counter 36 reaches sequence "11", NAND gates 64 and 66 remain high ("1"), thus forcing NOR gates 76 and 78 low ("0"). In these circumstances CLKI is close enough in frequency to CLKR that no digital adjustment is necessary, and any remaining adjustment to CLKI will be completed in an analog fashion.

NOR gates 76 and 78 drive NOR gate 80. Therefore, whenever either NOR gate 76 or 78 goes high to indicate that digital adjustment to CLKI is necessary, the output of NOR gate 80 goes low ("0"). NOR gate 80, in turn, provides an input to a NAND gate latch created by NAND gates 72 and 74. Because the "Q" output of flip-flop 46 that drives NAND gate 72 is a "1" (because at that time first counter 36 is at sequence "11"), the output of NAND gate 74 goes high. The output of NAND gate 74 is a control signal CLKS to shift register 14 and indicates to shift register 14 to shift either left or right depending upon the status of signals SR and SL (SR/L).

Control signals SR and SL (SR/L) communicate to shift register 14 whether to shift a "1" to the right (SR) thereby increasing the number of stages in CLKI or a "0" to the left (SL) thereby decreasing the number of stages in CLKI. Control signal SR is the "Q" output of flip-flop 54, and control signal SL is the "Q(bar)" output of flip-flop 54. Therefore, when first counter 36 reaches its third state value ("11") and second counter 38, at that instant, is at its eighth state value "0001"), then the "Q" output of flip-flop 54 is a "1" and the "Q(bar)" output is a "0". Therefore, control signal SR is a "1" while control signal SL is a "0" which indicates to shift register 14 to shift a "1" to the right and thereby increase the number of stages in CLKI. It follows then that when first counter 36 reaches its third sequence value ("11") and second counter 38, at that instant, is at either its first, second, or third state values ("0000", "1000", "1100"), that the fourth bit, that is the "Q" output of flip-flop 54, is a "0". Therefore, "Q(bar)" of flip-flop 54 is a "1" which means that control signal SR is a "0" and control signal SL is a "1." This status indicates to shift register 14 to shift a "0" to the left thereby decreasing the number of stages in CLKI.

Frequency discriminator circuit 12 also receives inputs back from shift register 14. Shift register 14 returns the inverse of its first bit ($Q_0$(bar)) and its last bit ($Q_N$) to indicate whether shift register 14 has shifted in all "0"'s or all "1"'s. $Q_0$(bar) is coupled with control signal SL into AND gate 70 while $Q_N$ is coupled with control signal SR through AND gate 68. When $Q_0$(bar) is a "1" (shift register 14 has shifted in all "0"'s) and control signal SL is a "1"

(frequency discriminator circuit 12 wants to further decrease delay) the output of AND gate 70 goes high thereby driving the output of NOR gate 78 low. Similarly, when $Q_N$ is a "1" (shift register 14 has shifted in all "1's") and control signal SR is a "1" (frequency discriminator circuit 14 wants to further increase delay) the output of AND gate 68 goes high thereby driving the output of NOR gate 76 low. In the instance where neither the output of NOR gates 76 or 78 go high, the latch created by NAND gates 72 and 74 is disabled and shift register 14 will no longer clock. Therefore all remaining adjustments will be done in an analog fashion.

Shift register 14 receives signals SR/L (SR or SL) and CLKS and outputs a plurality of digital signals that comprise a digital word ($Q_0, Q_1, \ldots Q_N$). The digital word acts as an input to VCO 16. VCO 16 is illustrated in detail in FIG. 7. The digital word from shift register 14 dictates the number of stages to either add or remove from VCO 16. For example, if VCO 16 has four delay increments, then N=3 and the digital word is three bits in length. If the digital word is "000" then $Q_0=0$, $Q_1=0$, and $Q_2=0$; then pass gate 96a will be a short circuit and pass gate 96b will be an open circuit. In this case the oscillator path will be through inverter 92b, pass gate 96a, inverter 92f, pass gate INIT(bar), and through inverter 92e. This constitutes the minimum number of stages possible for VCO 16. If the digital word is "111" then pass gates 96a, 98a, 100a and 102a are all open circuits and pass gates 96b, 98b, 100b and 102b are all short circuits and the delay path will be through inverter 92b, 92c, 92d, 92n, pass gate 102b, inverter 92n+1, pass gate 100b, inverter 92h, pass gate 98b, inverter 92g, pass gate 96b, inverter 92f, pass gate INIT(bar), and inverter 92e. This constitutes the maximum number of stages through VCO 16. Other digital words such as "100" and "110" would comprise other intermediate number of stages for VCO 16. Each time shift register 14 shifts to either the left or the right the number of stages in VCO 16 will be adjusted. Incremental adjustments in delay are two times the delay through each delay stage (a delay stage comprises the delay through a single inverter). The actual delay will depend upon the bias of $V_N$ and $V_P$.

Once frequency discriminator circuit 12 determines that CLKI and CLKR are close enough in frequency (second counter 38 is in one of states 4–7 when first counter 36 arrives at its state 3, see FIG. 8), PLL 10 discontinues digital adjust mode and analog adjust continues.

Phase detector 13 of FIG. 5 receives the two clock signals: reference clock signal CLKR and internal clock signal CLKI. Phase detector 13 effectively compares their phases such that when CLKR is high and CLKI is low (CLKI lags CLKR and therefore CLKI needs to speed up) the digital output signal QREF will be low and digital output signal QINT will be high. These signals effectively tell charge pump control circuit 15 to speed up CLKI (how this is accomplished will be described with respect to FIG. 4 and 4a). When CLKR is low and CLKI is high (CLKI leads CLKR and therefore CLKI needs to slow down) the digital output signal QREF is high and digital output signal QINT will go low. These signal states effectively tell charge pump control circuit to slow down CLKI.

With respect to FIG. 4a, when digital control signals QREF and QINT from phase detector 13 are both high, transistors 21 and 23 are off and analog control voltage $V_c$ maintains its voltage. When QREF is high and QINT is low then transistor 21 is off and transistor 23 is on. In this state, transistor 23 discharges the charge stored within the capacitance of external loop filter 19 thereby causing analog control voltage $V_c$ to decrease in an analog fashion. External loop filter 19 may be an RC-type low pass filter network whose time constant is determined by the user and which influences the rate of change of analog control voltage $V_c$. When the capacitance of external loop filter is high the rate of change of control voltage $V_c$ is slow. Likewise, when the capacitance of external loop filter is low the rate of change of analog control voltage $V_c$ is fast. When QREF is low and QINT is high transistor 21 is on and transistor 23 is off. Under these circumstances transistor 21 will charge the capacitance of external loop filter 19 causing analog control voltage $V_c$ to rise. Again the rate of change of analog control voltage $V_c$ depends upon the user's choice of capacitance in external loop filter 19. Therefore digital control signals QREF and QINT dictate whether analog control voltage $V_c$ increases or decreases.

Charge pump control circuit 15 of FIG. 4 provides control voltages $V_p$ and $V_N$ to the gate terminals of NMOS transistor 112 and PMOS transistor 118 of FIG. 9 or, alternatively, NMOS transistor 122 and PMOS transistor 124 of FIG. 9a. Charge pump 82 provides a control voltage $V_c$ to the gate of NMOS transistor 82. Control voltage $V_c$ controls $V_P$ and $V_N$ in the following way. When $V_c$ increases in value it rises above the threshold voltage value of transistor 26. Transistor 26 then begins to conduct which pulls $V_p$ (which is the drain of transistor 26) down toward ground. As $V_p$ decreases in voltage transistor 22 begins conducting. transistors 22 and 24 act as a current mirror; therefore, transistor 24 will begin conducting current. Transistor 24 will then pull $V_N$ up toward Vcc. Therefore, as $V_c$ increases, $V_N$ increases and $V_P$ decreases in an analog fashion. Using a similar analysis it is seen that as $V_c$ decreases in value, $V_N$ decreases and $V_P$ increases in an analog fashion.

With respect to FIG. 9, $V_p$ and $V_N$ provide control voltages that vary in an analog fashion. When $V_p$ is at approximately ground potential and $V_N$ is at approximately Vcc potential, PMOS transistor 118 is fully conducting and behaves like a short circuit. Similarly, NMOS transistor 112 is fully conducting and behaves like a short circuit. In this case, Vcc potential is at the source of PMOS transistor 116 and ground potential is at the source of NMOS transistor 114. Circuit 110 then approaches behavior of a standard CMOS inverter and has a minimum propagation delay.

As $V_p$ and $V_N$ vary in voltage in response to charge pump control circuit 15, PMOS transistor 118 and NMOS transistors 112 behave as variable resistors, changing the output impedance of inverter 110. As the impedance increases driving a fixed capacitive load, the propagation delay between the INPUT and OUTPUT of inverter 110 increases (inverter 110 switches more slowly) in an analog fashion, thereby providing greater resolution in frequency of CLKI. Each inverter in VCO 16 in FIG. 7, 92b–92n+1, may be constructed like inverter 110 of FIG. 9, thereby having variable analog delay functionality.

Alternatively, inverter 120 of FIG. 9a provides another inverter having variable analog delay functionality. PMOS transistor 128 and NMOS transistor 126 act as a standard CMOS inverter. NMOS transistor 122 and PMOS transistor 124 form a standard CMOS pass gate. However, instead of the gates of NMOS transistor 122 and PMOS transistor 124 being coupled to digital control signals they are coupled to analog control signals $V_p$ and $V_N$. Therefore the pass gate behaves as a variable resistor instead of a digital switch. The variable resistance of the pass gate coupled with the input effective gate capacitance of the CMOS inverter formed by transistors 126 and 128 comprise an RC time constant. Therefore the delay of inverter 120 is a function of the RC time constant that may vary in an analog fashion due to the analog resistance of the pass gate.

PLL 10 advantageously overcomes the limitations of prior art phase locked loop solutions by novelly merging a digital and analog solution, thereby providing fast phase locking functionality while concurrently achieving high resolution lock needed in high performance systems.

Although the invention has been described with reference to the preferred embodiment herein, this description is not to be construed in a limiting sense. Various modifications of the disclosed embodiment will become apparent to persons skilled in the art upon reference to the description of the invention. It is therefore contemplated that the appended claims will cover any such modifications or embodiments as fall within the true scope of the invention.

What is claimed is:

1. A phase locked loop circuit, comprising:

a frequency discriminator circuit for comparing the frequency of a first signal with the frequency of a second signal. and providing a first set of control signals in response to the comparison;

a shift register coupled to the frequency discriminator circuit, the shift register receiving the first set of control signals from the frequency discriminator circuit and shifting a binary value to the left or right in response to the first set of control signals, the shifting of the binary value to the left or right thereby creating a digital word;

an oscillator circuit coupled to the shift register, the oscillator circuit adjusting the frequency and phase of the second signal in a digital manner in response to the digital word from the shift register;

a phase detector for comparing the phase of the first signal with the phase of the second signal, and for providing a second set of control signals in response to the comparison; and a control circuit coupled to the phase detector and the oscillator circuit, the control circuit converting the second set of control signals into analog control signals, the oscillation circuit being responsive to the analog control signals for adjusting the phase of the second signal in an analog manner.

2. The phase locked loop of claim 1 wherein the oscillator circuit comprises a voltage controlled oscillator.

3. The phase locked loop of claim 2 wherein the voltage controlled oscillator circuit comprises a plurality of serially coupled delay increment stages, each delay increment stage further comprising:

a first inverter having an input coupled to a preceding delay increment stage and having an output coupled to a subsequent delay increment stage;

a first pass gate having a first terminal coupled to the output of the first inverter and having a second terminal;

a second pass gate having a first terminal coupled to the second terminal of the first pass gate and having a second terminal coupled to the subsequent delay stage; and a second inverter having an input coupled to the second terminal of the first pass gate and having an output coupled to the preceding delay increment stage.

4. The phase locked loop of claim 1 wherein the frequency discriminator circuit comprises:

a third counter, wherein the third counter increments at a rate determined by a reference clock signal;

a fourth counter, wherein the fourth counter increments at a rate determined by an internal clock signal; and a compare circuit connected to the third counter and the fourth counter, wherein the compare circuit outputs a control signal in response to the value of the second counter when the first counter reaches a predetermined value.

5. The phase locked loop circuit of claim 4 wherein the third counter and the fourth counter comprise Johnson-type counters.

6. The phase locked loop circuit of claim 6 wherein the control circuit comprises:

a charge pump; and an analog control circuit connected to the charge pump.

7. The phase locked loop circuit of claim 6 wherein the charge pump comprises:

a capacitive network coupled to a node;

a charging circuit, wherein the charging circuit receives a digital signal from the phase detector and charges the capacitive network to increase the voltage at the node in an analog fashion; and a discharge circuit, wherein the discharge circuit receives a digital signal from the phase detector and discharges the capacitive network to decrease the voltage at the specified node in an analog fashion.

8. The phase locked bop of claim 6 wherein the analog control circuit comprises:

a voltage controlled current source coupled to the charge pump;

a current mirror connected to the voltage controlled current source, wherein the current mirror produces a first analog control voltage; and a current controlled voltage source coupled to the current mirror, wherein the current magnitude of the current mirror produces a second analog control voltage.

\* \* \* \* \*

UNITED STATES PATENT AND TRADEMARK OFFICE
CERTIFICATE OF CORRECTION

PATENT NO. : 5,487,093
DATED : Jan. 23, 1996
INVENTOR(S) : Bernhard H. Andresen and Roger A. Cline It is certified that error appears in the above-indentified patent and that said Letters Patent is hereby corrected as shown below:

On the title page: Item [75] Inventors:
Please correct inventor's name Bernhard H. "Adresen"

to Bernhard H. "Andresen".

Item [19] "Adresen et al" should read --Andresen et al --.

Signed and Sealed this

Twenty-eighth Day of May, 1996

*Attest:*

BRUCE LEHMAN

*Attesting Officer*     *Commissioner of Patents and Trademarks*